United States Patent
Chen et al.

(10) Patent No.: US 7,124,383 B2
(45) Date of Patent: Oct. 17, 2006

(54) INTEGRATED PROOF FLOW SYSTEM AND METHOD

(75) Inventors: Kuang-Chien Chen, Fremont, CA (US); Bow-Yaw Wang, Nankang (TW)

(73) Assignee: Cadence Design Systems, Inc., San Jose, CA (US)

( * ) Notice: Subject to any disclaimer, the term of this patent is extended or adjusted under 35 U.S.C. 154(b) by 32 days.

(21) Appl. No.: 10/440,436

(22) Filed: May 15, 2003

(65) Prior Publication Data

US 2004/0230927 A1    Nov. 18, 2004

(51) Int. Cl.
    *G06F 17/50*    (2006.01)
(52) U.S. Cl. .................. 716/5; 716/4; 714/32; 703/14
(58) Field of Classification Search ............... 716/4–6; 714/32–35, 38, 39, 45–47, 724; 703/13–17; 717/1, 2, 4, 107
    See application file for complete search history.

(56) References Cited

U.S. PATENT DOCUMENTS 6,212,675 B1 *   4/2001   Johnston et al. ............ 717/107

(Continued)

FOREIGN PATENT DOCUMENTS

WO    WO 01/88765 A2    11/2001

OTHER PUBLICATIONS

Bartley, Mike G. et al., "A Comparison of Three Verification Techniques: Directed Testing, Pseudo-Random Testing and Property Checking," Proceedings of the 39th ACM/IEEE Design Automation Conference, (Jun. 2002) 6 pgs.

Burch; J.R. et al., "Symbolic Model Checking: $10^{20}$ States and Beyond," Proceedings of the Fifth Annual Symposium on Logic in Computer Science, (Jun. 1990) pp. 1-33.

Cabodi, Gianpiero et al., "Symbolic Exploration of Large Circuits with Enhanced Forward/Backward Traversals," Proceedings of the European Conference on Design Automation, (Feb. 1994) pp. 22-27.

Iwashita, Hiroaki et al., "CTL Model Checking Based on Forward State Traversal," Proceedings of the 1996 International Conference on Computer-Aided Design, (Nov. 1996), pp. 82-87.

Kuehlmann, Andreas et al., "Probabilistic State Space Search," Proceedings of International Conference on Computer Aided Design, (Nov. 1999) pp. 574-579.

(Continued)

*Primary Examiner*—Vuthe Siek
(74) *Attorney, Agent, or Firm*—Bingham McCutchen LLP

(57) ABSTRACT

Integrated proof flow methods and apparatuses are discussed. Integrated proof flow refers to attempting both formal verification and nonformal verification. A coverage metric can be changed by both attempting formal verification and by attempting nonformal verification. Some embodiments of the present invention provide proof flow methods that integrate verification and nonformal verification (e.g., bounded verification, multi-point proof, and/or vector-based simulation) to prove one or more properties in a circuit design.

59 Claims, 4 Drawing Sheets

U.S. PATENT DOCUMENTS

| | | | |
|---|---|---|---|
| 6,484,134 B1* | 11/2002 | Hoskote | 703/14 |
| 6,553,514 B1* | 4/2003 | Baumgartner et al. | 714/32 |
| 6,742,166 B1* | 5/2004 | Foster et al. | 716/4 |
| 6,745,374 B1* | 6/2004 | Tekumalla et al. | 716/4 |
| 2002/0078424 A1* | 6/2002 | Buckley, Jr. | 716/5 |
| 2003/0076723 A1* | 4/2003 | Zarrineh et al. | 365/201 |

OTHER PUBLICATIONS

Yang, C. Han et al., "Validation with Guided Search of the State Space," 35th Design Automation Conference, (Jun. 1998), pp. 599-604.

Yuan, Jun et al., "On Combining Formal and Informal Verification," Proceedings of the 9th International Conference on Computer Aided Verification, (Jun. 1997) pp. 376-387.

Azzoni, P. et al., "An Error Simulation Based Approach to Measure Error Coverage of Formal Properties," Proceedings of the 12th ACM Great Lakes Symposium on VLSI ACE, (Apr. 2002) pp. 53-57.

Lu, Yuan et al., "A Semi-formal Verification Methodology," Proceedings of the 4th International ASIC Conference, (Oct. 2001) pp. 33-37.

Emmitt, J. "Open Verification Library Aids Formal Verification And Simulation Methodology," TechOnLine (Feb. 2001) pp. 1-6.

Ferrandi, F. et al., "Functional Test Generation For Behaviorally Sequential Models," Design, Automation and Test in Europe Conference and Exhibition (Mar. 2001) pp. 403-410.

International Search Report, Jul. 29, 2005 (PCT/US2004/015093).

* cited by examiner

INTEGRATED PROOF FLOW SYSTEM AND METHOD

BACKGROUND OF THE INVENTION

The present invention relates generally to functional verification of properties associated with circuit designs and, more particularly, to an integrated proof flow for the verification of such properties.

DESCRIPTION OF THE RELATED ART

Verification is typically the most time-consuming component in a circuit design process. Failing to detect functional design errors early in the design stages usually leads to expensive re-spin of the designs. This re-spin includes diagnosis and correction of the errors, logic and physical re-synthesis, and even re-manufacturing of the chips that can be very time-consuming, costly and delay the time-to-market of a product. If the chip designs are already used in some released products, this can even lead to product recalls that are very devastating to a company.

Property checking is an approach for verifying the functionality of a circuit design. It involves proving one or more properties specified for a circuit design. A property, which can also be called an assertion, may be logical (e.g., Boolean) and/or temporal, and describes behavior of one or more signals in the circuit design.

Formal verification of a property verifies that the property holds for all combinations of input signals and sequences over time. For example, to verify that a property holds, formal verification tools or methods attempt to check all states possible during operation of the circuit design, where the operation starts from one or more initial states of the circuit design. Successfully checking all the states ensures that the property is not violated. During the state space search, if a contradiction is found, the property is disproved and a counter example can usually be generated to demonstrate how the violation occurs.

Formal verification is therefore very useful for uncovering corner-case bugs because it determines whether or not a property is true in the circuit design by exercising all possible behavior of the circuit design. However, due to the exceedingly large and complex circuits that are being designed today, formal verification is subject to the classical state explosion problem. For example, a typical circuit design may contain hundreds of thousands of state variables (state-holding elements, i.e. flip flops), where each state variable may have one of two values, either 0 or 1. The number of possible value combinations (or states) that are required to be checked by formal verification techniques is extremely large, and some states can only be reached after a very large number of cycles. It is therefore very difficult to perform state space search exhaustively for large designs. Such complexity presents memory and time constraints that make formal verification for large, but typical, circuit designs intractable.

Nonformal verification, (also called semi-formal verification), is another approach to handle difficult and complex circuits and properties. Nonformal verification checks the property over a subset of the states that are of concern in formal verification. One or more types of nonformal verification may be performed. Although nonformal verification does not search all the possible states of a circuit, it can usually handle large circuits and may find bugs that cannot be found by formal verification techniques. One or more nonformal verification techniques may be performed on a circuit for a given set of properties, and one nonformal verification technique may find bugs which are missed by another nonformal verification technique.

One example of nonformal verification is bounded verification, which determines whether or not a property is true in the circuit design for a specific number of cycles. In contrast to the exhaustive search associated with formal verification (also known as unbounded verification), bounded verification is called nonformal because it only checks the behavior exhaustively for a limited number of cycles. Its main benefit is that the limitation on the number of cycles usually greatly reduces the complexity of the verification problem.

Another example of nonformal verification technique is the local search based multi-point proof method. In this method, bounded search up to a limited number of cycles is performed by starting from different states. These different starting states can be determined by the program automatically and/or can be specified by the user. By starting from different states and performing limited cycle searches from those states, the chance of finding bugs in the design is increased, in contrast with using just a single starting state.

Simulation is another nonformal verification approach used to verify a circuit design. Simulation techniques typically utilize simulation vectors to determine whether or not a circuit design functions in an expected manner. Such simulation runs are usually non-exhaustive, and various coverage metrics, for example, hardware description language (HDL)-based code coverages, are used to assess the quality of the simulation vectors and determine when to stop the simulation process. Conventional simulation techniques do not maintain prior test or coverage information, and the verification vectors are derived independent of prior test or coverage information. For example, simulation vectors are typically manually derived by designers or randomly generated from the high-level description of the design and its environment. Therefore, the number of simulation vectors necessary to suitably verify a circuit design can be prohibitive. Techniques have been proposed to derive more effective simulation vectors, so that specific target states can be reached more easily and also consider the states that have been reached by prior simulation to avoid redundant work. Such techniques hold the promise to provide a more effective simulation environment.

Formal verification, and nonformal verification (e.g., bounded verification, multi-point proof, and vector-based simulation) are verification techniques that have their own advantages and disadvantages. There is a need to tightly integrate all these techniques in a unified verification framework to provide a robust verification solution. It is also necessary to further improve the vector based simulation process so that more effective simulation vectors can be generated to improve the overall functional coverage.

SUMMARY

Accordingly, some embodiments of the present invention provide integrated proof flow methods and apparatuses. Integrated proof flow refers to attempting both formal verification and nonformal verification. A coverage metric can be changed by both attempting formal verification and by attempting nonformal verification.

Some embodiments of the present invention provide proof flow methods that integrate formal verification and nonformal verification (e.g., bounded verification, multi-point proof, and/or vector-based simulation) to prove one or more properties in a circuit design.

DETAILED DESCRIPTION

Figure 1:
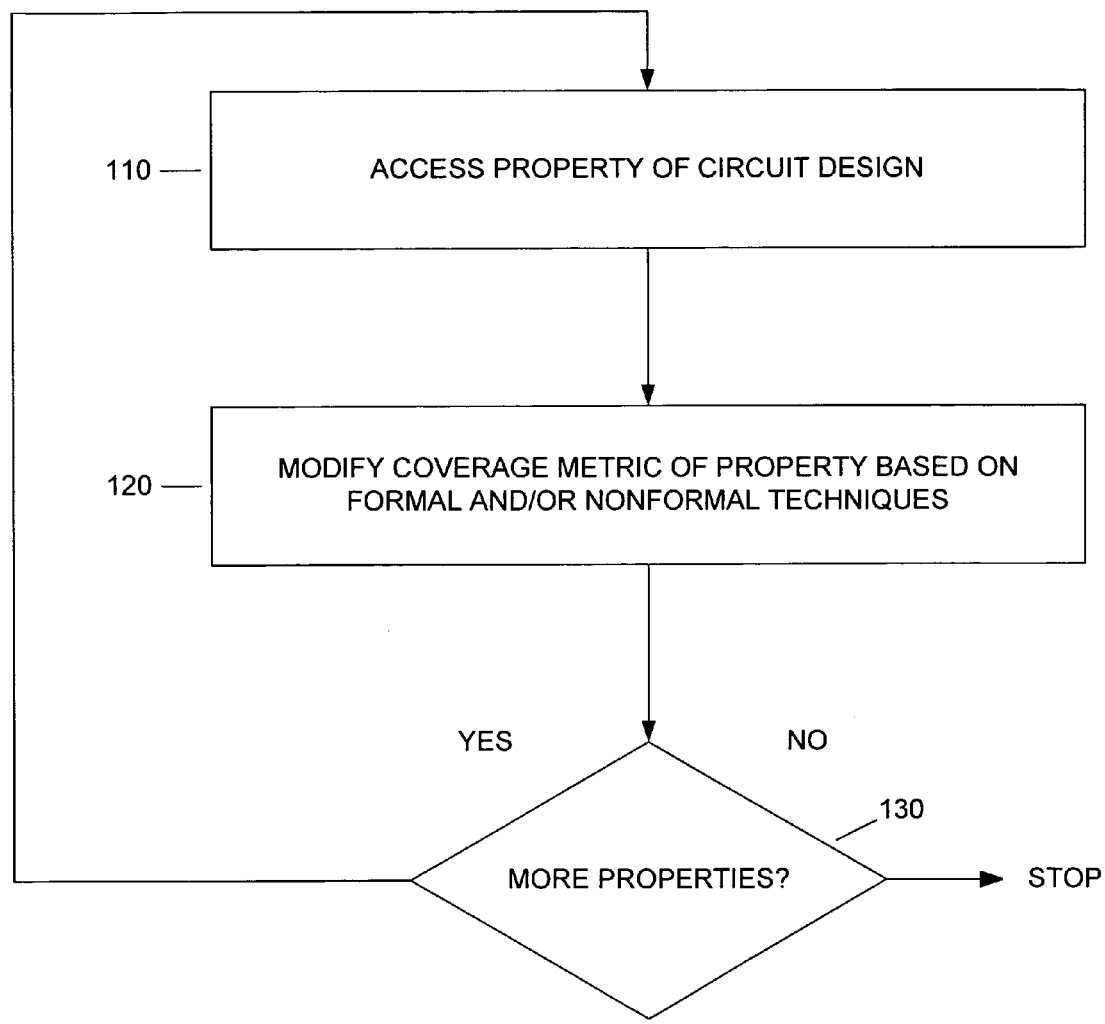
FIG. 1 shows an example of an overall proof flow.

Referring to FIG. 1, one embodiment of a proof flow method for a set of properties associated with a circuit design is illustrated. Examples of properties are "signal A should always be True" and "signals A, B, and C should always satisfy the relationship that A×B=C for all clock "cycles".

For a given property, one or more coverage metrics can be defined. If multiple coverage metrics are defined for a given property, the multiple coverage metrics can be of the same or different kinds. In the case where at least two coverage metrics of the same kind exist, different criteria can be used (e.g., if at least two metrics are of the toggle-based metric type, the sequential elements can have different weights when calculating the overall coverage).

One such metric is the state-based metric, where the goal is to search all the reachable states of the circuit and check the correctness of the property in each of the states. If the property can be verified by formal verification, it means all the reachable states are searched and therefore the coverage is 100%. However, if only a partial set of reachable states can be searched due to, for example, memory and/or runtime constraint, then the coverage metric can be some measure of the number of states searched, for example, the number of states searched divided by the total number of reachable states.

Another metric is the toggle-based metric. For every signal driven by a sequential element in the cone of logic of the property, the goal is to toggle the signal during the checking of the property. In some embodiments, the more such signals are toggled, the more thoroughly the property is checked. In some embodiments, some such signals may not toggle, and such situations should be taken into account. If a property can be verified by formal verification, the toggle based coverage is 100%. Otherwise, if there are N sequential elements in the logic cone of the property, and M out of the N elements can not be toggled (e.g., their value is either constant 0 or 1), then the coverage metric can be a measure of toggled elements (e.g., sequential elements), for example, the number of sequential elements that are toggled during the property verification divided by (N–M).

Another kind of coverage metric is the code structure based metric. Code structure based coverage metrics can measure the effectiveness of simulation. Examples of code structure based metrics are line coverage metrics (i.e., how many lines of the RTL code have been exercised in simulation), branch coverage metrics (i.e., in all the possible execution branching conditions, how many of them are exercised in simulation), and path coverage metrics (i.e., in all the possible execution paths of the code, how many of them are exercised in simulation). For the verification of a particular property, the correspondence between the logic cone of the property and the RTL code can be established. Then, one or more code structure based coverage metrics can be used to measure how well a property is verified. For example, for a line coverage metric, during the search process of verifying a property, the number of lines of the RTL code (corresponding to the property logic cone) which have been exercised can be kept track of. This information can be used to calculate the line coverage metric.

Another kind of coverage metric is the user-defined metric and there can be many variations. One example of user-defined metric is a set of key signals in the logic cone of the property that are selected by the user, and the goal of the verification is to exhaustively check all possible combinations of the set of key signals during property verification. Some combinations of the key signals may not be reachable, and such situation should be taken into account. If a property can be verified by formal verification, the key signal combination coverage is 100%. Otherwise, the coverage metric can be a measure of key signal combinations, for example, the number of key signal combinations divided by the total number of possible combinations of the set of key signals.

Yet another coverage metric can combine multiple kinds of coverage metrics.

For the given set of properties of a circuit design, the following steps can be performed for each of the properties, at least partly concurrently, at least partly before, and/or at least partly after, one another:

(i) a coverage metric is defined for one or more properties. A coverage metric that defines how well a property is proved can be defined by the tool automatically and/or by the user. If a property is proven by formal verification successfully, its coverage is 100%. The coverage of a property is less than 100% if it cannot be proven successfully by formal or nonformal verification due to, for example, a space or time limit. Using multiple techniques can increase the coverage of a property, to help satisfy the goal of verification by obtaining a high coverage for a property. By defining a coverage metric for a property, different techniques can be guided by the same coverage metric, and try to modify it, such as by increasing it.

(ii) a formal verification is attempted for one or more properties, and (iii) a nonformal verification is attempted of one or more properties.

Formal verification can include one or more formal verification steps. Unbounded formal verification of a property is attempted, and the attempt may succeed or fail. Coverage information based on the coverage metric is calculated during or after the verification step.

Nonformal verification can include one or more nonformal verification steps. The nonformal verification steps can be selected from, for example, (a) attempting a bounded verification of a property with increasing numbers of cycles starting from an initial state, (b) attempting a bounded verification of a property with a limited number of cycles (which can be the same or different from each starting point, and can be determined by heuristics and/or manually by the user, etc.) beginning with different starting states, and (c) attempting a coverage-driven simulation of the property. Coverage information, based on the coverage metric selected in (i), can be calculated and updated in any of the nonformal verification steps (a), (b), and (c).

Each property can have identical or different optional nonformal verification steps of (a), (b), and (c). The bounds of the bounded verification of step (a) of the optional nonformal verification can be selected by the user or automatically by a program. The limited number of cycles and the different starting states of step (b) of the optional nonformal verification (from step (b)) can be selected by the user or automatically by a program.

FIG. 1 shows an example of a proof flow. In 110, a property of a circuit design is accessed. For example, the property can be retrieved from a local location and/or remote location, and/or the property can be generated and accessed. In 120, a coverage metric of the property is modified. In 130, if more properties of interest exist, the proof flow can be repeated with another property.

Many other proof flow embodiments exist. Parts can be added, removed, rearranged, and/or changed. For example, multiple properties can be accessed, and/or multiple coverage metrics of one or more properties can be modified at least partly concurrently. Accessing the property and modifying the coverage metric can occur at least partly concurrently.

Figure 2:
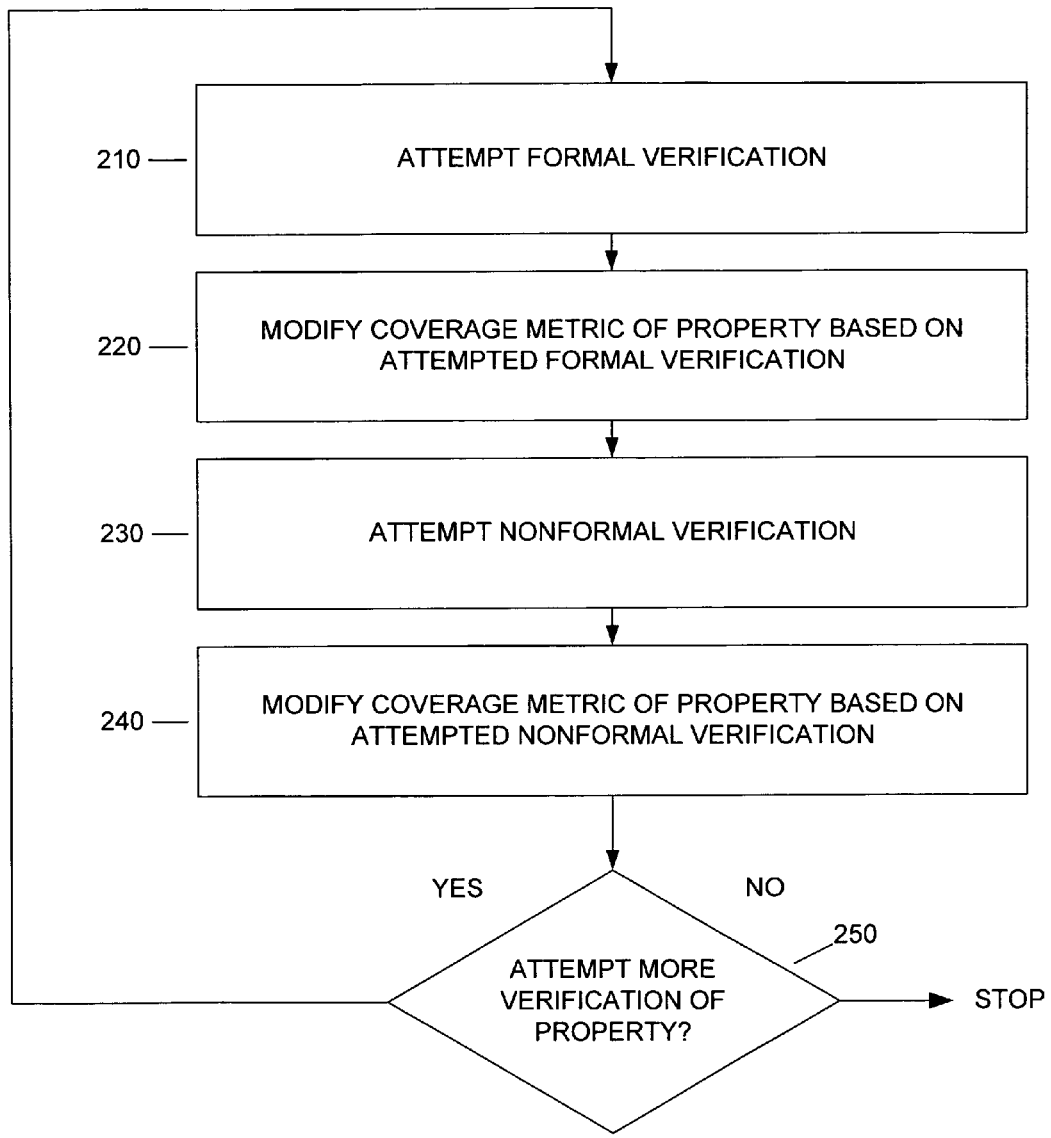
FIG. 2 shows an example of modifying a coverage metric of a property.

FIG. 2 shows an example of modifying a coverage metric of a property. In 210, formal verification is attempted. In 220, the coverage metric of the property is modified based on the attempted formal verification. In 230, nonformal verification is attempted. In 240, the coverage metric of the property is modified based on the attempted nonformal verification. In 250, if more verification is to be attempted, the above can occur again and the coverage metric can be further modified.

Many other embodiments exist for modifying the coverage metric. Parts can be added, removed, rearranged, and/or changed. For example, the coverage metric can be modified at least partly concurrently with attempted verification. Attempted formal verification can occur after and/or at least partly concurrently with attempted nonformal verification.

Figure 3:
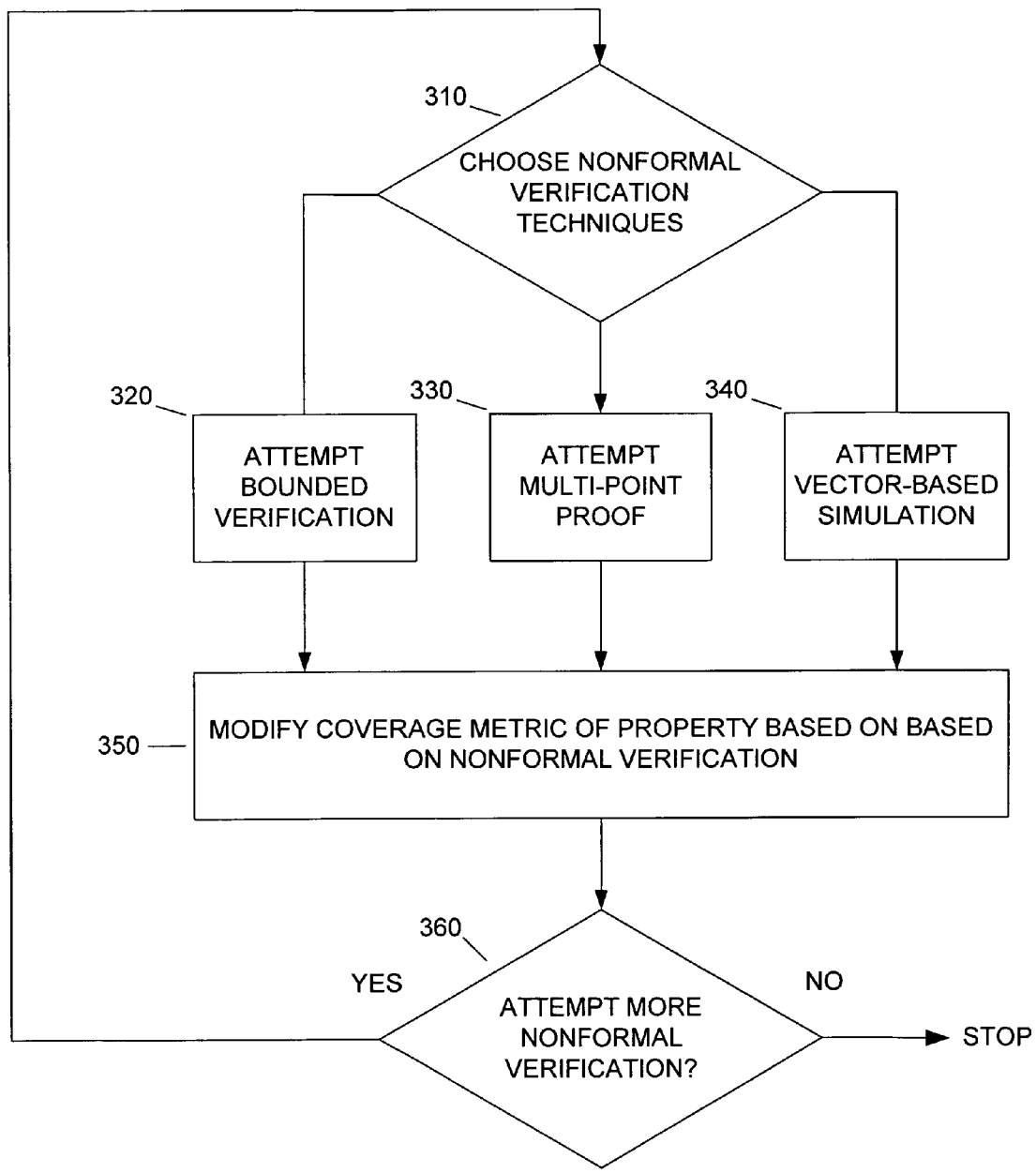
FIG. 3 shows an example of attempting nonformal verification.

FIG. 3 shows an example of attempting nonformal verification. In 310, a nonformal verification technique is chosen. Depending on the result of 310, a particular nonformal verification technique is attempted, such as bounded verification 320, multi-point proof 330, and vector-based simulation 340. In 350, the coverage metric is modified based on the attempted nonformal verification. In 360, if more nonformal verification is to be attempted, then the above can occur again.

Many other embodiments exist for attempting nonformal verification. Parts can be added, removed, rearranged, and/or changed. For example, multiple nonformal verification techniques can be attempted, at least partly concurrently and/or at least partly sequentially. The coverage metric can be modified at least partly concurrently with attempted verification.

In some embodiments, the different nonformal verification techniques can be coverage driven.

In one example of a proof flow, given a 16-bit counter initialized to 0, an accessed property states that the counter never counts beyond 10,000. In this example, resources are exhausted beyond 4,000 cycles and the attempted formal verification failed. The coverage metric is state-based and 30,000 states have been searched during the formal verification proof. Nonformal verification is attempted. Bounded verification is attempted from each time frame number in a list of time frame numbers, e.g. {0, 2,000, 4,000, 5,000}, and results in an increase of the coverage metric from 30,000 states to 55,000 states out of the possible 65,536 states of the counter. Vector-based simulation is attempted to increase the coverage metric. Vectors are generated to simulate the accessed property that the counter never counts beyond 10,000. Unfortunately, due to resource limitations, such as time, only 6,000 additional states are reached in the vector-based simulation. The final coverage metric result is 61,000 states out of 65,536 states, or approximately 93%.

In another example of a proof flow, an accessed property about 2 signals, A and B, of a control circuit is that whenever A is true, B becomes true after 3 clock cycles. There are 330 flip-flops in the logic cone representing this property and a toggle-based coverage metric is used. Starting from an initial state, formal verification is attempted but fails after searching for 50 cycles. 150 flip-flops are determined to have both 0 and 1 configurations examined during the search and it is also found that 30 flip-flops cannot be toggled due to certain constraints of the circuit. The resulting coverage is therefore 150/(330−30)=50%. Multi-point proof nonformal verification is then attempted to increase the coverage. A set of starting states, which have been confirmed to be reachable since they are extracted from an existing simulation result of the circuit, are provided, and then limited-cycle searches are performed by starting from each of the set of starting states. 75 additional flip-flops are determined to have both 0 and 1 configurations examined during the multi-point nonformal proof. Therefore the coverage is increased to 225/(330−30) =75%. Finally coverage-driven vector-based simulation nonformal verification is attempted to target those flip-flops which have not been toggled. After generating and simulating 2500 vectors, an additional 50 flip-flops are toggled. The final coverage is increased to 275(330−30)=91%. The property is still not proven to be true because not all possible reachable states are searched. But there is a high confidence because 91% of the flip-flops have both 0 and 1 configurations examined during the application of formal and nonformal verification techniques.

Figure 4:
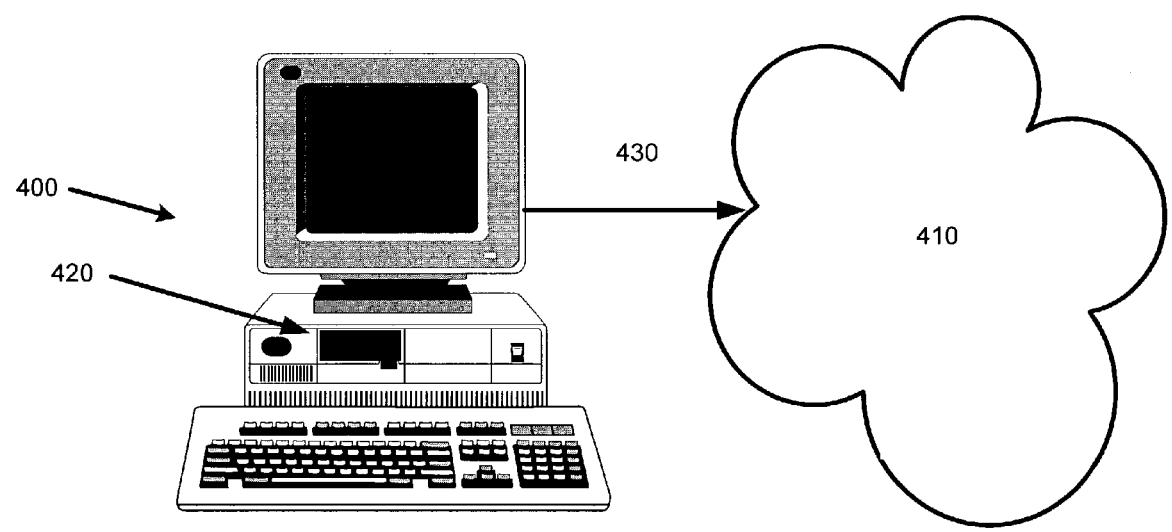
FIG. 4 shows an example of a computer capable of executing proof flow.

FIG. 4 shows an example of a computer 400 that can execute a proof flow, which can be code 420. The computer 400 can be connected to a network 410. The computer 400 can execute code 420 with instructions to execute the proof flow. The computer 400 can have the code 420 preinstalled. The computer 400 can receive the code 420 over the network 410, which can be connected to the computer via a link 430, which can be a wireless and/or wired link. The code 400 can be in a temporary state (e.g., electrical, magnetic, and/or optical signal) and/or at least partly hardware, such as in a relatively permanent state (e.g., optical disk, magnetic disk, hard disk, temporary memory such as RAM, flash memory, processor). The computer 400 can have the code 420 installed via such a temporary and/or relatively permanent state hardware. Multiprocessor, multicomputer, and/or multithread implementations can be practiced.

What is claimed is:

1. A method of checking a circuit design including a plurality of flip flops adapted to hold a plurality of values and a plurality of combinational elements, comprising:

accessing a plurality of one or more properties of the circuit design, wherein each property of the plurality of one or more properties describes behavior of one or more signals in at least part of the circuit design; and modifying at least a first coverage metric of at least one property of the plurality of one or more properties of the circuit design, based on at least: initially attempting formal verification and then attempting nonformal verification;

wherein formal verification at least checks behavior defined in the at least one property over all states possible during operation of the circuit design, the operation starting from one or more initial states of the circuit design, and each state of the all states is characterized by the plurality of values held in the plurality of flip-flops of the circuit design; and wherein nonformal verification checks at least the behavior defined in the at least one property over a subset of the all states possible during operation of the circuit design.

2. The method of claim 1, wherein attempting formal verification on one or more properties of the plurality of one or more properties includes failing to perform formal verification on at least one of the one or more properties of the plurality of one or more properties.

3. The method of claim 1, wherein attempting formal verification on one or more properties of the plurality of one or more properties includes successfully performing formal verification on at least one of the one or more properties of the plurality of one or more properties.

4. The method of claim 1, wherein attempting nonformal verification on one or more properties of the plurality of one or more properties includes failing to perform nonformal verification on at least one of the one or more properties of the plurality of one or more properties.

5. The method of claim 1, wherein attempting nonformal verification on one or more properties of the plurality of one or more properties includes successfully performing nonformal verification on at least one of the one or more properties of the plurality of one or more properties.

6. The method of claim 1, wherein at least the first coverage metric includes at least a toggle-based metric.

7. The method of claim 1, wherein at least the first coverage metric includes at least a state-based metric.

8. The method of claim 1, wherein at least the first coverage metric includes at least a code structure-based metric.

9. The method of claim 8, wherein the code structure-based metric includes at least a line coverage metric.

10. The method of claim 8, wherein the code structure-based metric includes at least a path coverage metric.

11. The method of claim 8, wherein the code structure-based metric includes at least a branch coverage metric.

12. The method of claim 1, wherein at least the first coverage metric includes at least a user-based metric.

13. The method of claim 12, wherein at least the first coverage metric measures at least key signal combinations.

14. The method of claim 1, wherein the nonformal verification includes bounded verification.

15. The method of claim 1, wherein the nonformal verification includes multi-point proof.

16. The method of claim 1, wherein the nonformal verification includes vector-based simulation.

17. The method of claim 1, wherein the informal verification is performed only upon failure of the formal verification.

18. A computer program product that includes a medium usable by a processor, the medium having stored thereon a sequence of instructions which, when executed by said processor, causes said processor to execute a method for checking a circuit design including a plurality of flip flops adapted to hold a plurality of values and a plurality of combinational elements, said method comprising:

accessing a plurality of one or more properties of the circuit design, wherein each property of the plurality of one or more properties describes behavior of one or more signals in at least part of the circuit design; and modifying at least a first coverage metric of at least one property of the plurality of one or more properties of the circuit design, based on at least: initially attempting formal verification and then attempting nonformal verification;

wherein formal verification at least checks behavior defined in the at least one property over all states possible during operation of the circuit design, the operation starting from one or more initial states of the circuit design, and each state of the all states is characterized by the plurality of values held in the plurality of flip-flops of the circuit design; and wherein nonformal verification checks at least the behavior defined in the at least one property over a subset of the all states possible during operation of the circuit design.

19. The computer program product of claim 18, wherein at least part of the computer program product is software.

20. The computer program product of claim 18 wherein at least part of the computer program product is hardware.

21. The computer program product of claim 18, wherein attempting formal verification on one or more properties of the plurality of one or more properties includes failing to perform formal verification on at least one of the one or more properties of the plurality of one or more properties.

22. The computer program product of claim 18, wherein attempting formal verification on one or more properties of the plurality of one or more properties includes successfully performing formal verification on at least one of the one or more properties of the plurality of one or more properties.

23. The computer program product of claim 18, wherein attempting nonformal verification on one or more properties of the plurality of one or more properties includes failing to perform nonformal verification on at least one of the one or more properties of the plurality of one or more properties.

24. The computer program product of claim 18, wherein attempting nonformal verification on one or more properties of the plurality of one or more properties includes successfully performing nonformal verification on at least one of the one or more properties of the plurality of one or more properties.

25. The computer program product of claim 18, wherein at least the first coverage metric includes at least a toggle-based metric, a state-based metric, a code structure-based metric, or a user-based metric.

26. The computer program product of claim 25, wherein the code structure-based metric includes at least a line coverage metric, a path coverage metric, or a branch coverage metric.

27. The computer program product of claim 18, wherein at least the first coverage metric measures at least key signal combinations.

28. The computer program product of claim 18, wherein nonformal verification includes at least bounded verification, multipoint proof, or vector-based simulation.

29. The computer program product of claim 18, wherein the first coverage metric combines multiple coverage metrics.

30. The computer program product of claim 18, wherein the informal verification is performed only upon failure of the formal verification.

31. An apparatus for checking a circuit design including a plurality of flip flops adapted to hold a plurality of values and a plurality of combinational elements, comprising:

means for accessing a plurality of one or more properties of the circuit design, wherein each property of the plurality of one or more properties describes behavior of one or more signals in at least part of the circuit design; and means for modifying at least a first coverage metric of at least one property of the plurality of one or more properties of the circuit design, based on at least: initially attempting formal verification and then attempting nonformal verification, wherein formal verification at least checks behavior defined in the at least one property over all states possible during operation of the circuit design, the operation starting from one or more initial states of the circuit design, and each state of the all states is characterized by the plurality of values held in the plurality of flip-flops of the circuit design, and wherein nonformal verification checks at least the behavior defined in the at least one property over a subset of the all states possible during operation of the circuit design.

32. The apparatus of claim 31, wherein attempting formal verification on one or more properties of the plurality of one or more properties includes failing to perform formal verification on at least one of the one or more properties of the plurality of one or more properties.

33. The apparatus of claim 31, wherein attempting formal verification on one or more properties of the plurality of one or more properties includes successfully performing formal verification on at least one of the one or more properties of the plurality of one or more properties.

34. The apparatus of claim 31, wherein attempting nonformal verification on one or more properties of the plurality of one or more properties includes failing to perform nonformal verification on at least one of the one or more properties of the plurality of one or more properties.

35. The apparatus of claim 31, wherein attempting nonformal verification on one or more properties of the plurality of one or more properties includes successfully performing nonformal verification on at least one of the one or more properties of the plurality of one or more properties.

36. The apparatus of claim 31, wherein at least the first coverage metric includes at least a toggle-based metric, a state-based metric, a code structure-based metric, or a user-based metric.

37. The apparatus of claim 36, wherein the code structure-based metric includes at least a line coverage metric, a path coverage metric, or a branch coverage metric.

38. The apparatus of claim 31, wherein at least the first coverage metric measures at least key signal combinations.

39. The apparatus of claim 31, wherein nonformal verification includes at least bounded verification, multipoint proof, or vector-based simulation.

40. The apparatus of claim 31, wherein the first coverage metric combines multiple coverage metrics.

41. The apparatus of claim 31, wherein the informal verification is performed only upon failure of the formal verification.

42. A method of checking a circuit design, comprising:
accessing a plurality of one or more properties of the circuit design, wherein each property of the plurality of one or more properties describes behavior of one or more signals in at least part of the circuit design; and
modifying at least a first coverage metric of at least one property of the plurality of one or more properties of the circuit design, based on at least: initially attempting formal verification and then attempting nonformal verification.

43. The method of claim 42, wherein at least the first coverage metric includes at least a toggle-based metric, a state-based metric, a code structure-based metric, or a user-based metric.

44. The method of claim 43, wherein the code structure-based metric includes at least a line coverage metric, a path coverage metric, or a branch coverage metric.

45. The method of claim 42, wherein at least the first coverage metric measures at least key signal combinations.

46. The method of claim 42, wherein nonformal verification includes at least bounded verification, multipoint proof, or vector-based simulation.

47. The method of claim 42, wherein the informal verification is performed only upon failure of the formal verification.

48. A computer program product that includes a medium usable by a processor, the medium having stored thereon a sequence of instructions which, when executed by said processor, causes said processor to execute a method of checking a circuit design, said method comprising:
accessing a plurality of one or more properties of the circuit design, wherein each property of the plurality of one or more properties describes behavior of one or more signals in at least part of the circuit design; and
modifying at least a first coverage metric of at least one property of the plurality of one or more properties of the circuit design, based on at least: initially attempting formal verification and then attempting nonformal verification.

49. The computer program product of claim 48, wherein at least the first coverage metric includes at least a toggle-based metric, a state-based metric, a code structure-based metric, or a user-based metric.

50. The method of claim 49, wherein the code structure-based metric includes at least a line coverage metric, a path coverage metric, or a branch coverage metric.

51. The computer program product of claim 48, wherein at least the first coverage metric measures at least key signal combinations.

52. The computer program product of claim 48, wherein nonformal verification includes at least bounded verification, multipoint proof, or vector-based simulation.

53. The computer program product of claim 48, wherein the informal verification is performed only upon failure of the formal verification.

54. An apparatus for checking a circuit design, comprising:
means for accessing a plurality of one or more properties of the circuit design, wherein each property of the plurality of one or more properties describes behavior of one or more signals in at least part of the circuit design; and
means for modifying at least a first coverage metric of at least one property of the plurality of one or more properties of the circuit design, based on at least: initially attempting formal verification and then attempting nonformal verification.

55. The apparatus of claim 54, wherein at least the first coverage metric includes at least a toggle-based metric, a state-based metric, a code structure-based metric, or a user-based metric.

56. The apparatus of claim 55, wherein the code structure-based metric includes at least a line coverage metric, a path coverage metric, or a branch coverage metric.

57. The apparatus of claim 54, wherein at least the first coverage metric measures at least key signal combinations.

58. The apparatus of claim 54, wherein nonformal verification includes at least bounded verification, multipoint proof, or vector-based simulation.

59. The apparatus of claim 54, wherein the informal verification is performed only upon failure of the formal verification.

* * * * *